United States Patent
Kang et al.

(10) Patent No.: US 8,290,059 B2
(45) Date of Patent: Oct. 16, 2012

(54) METHOD AND APPARATUS FOR PRESERVING DEINTERLEAVING ERASURE INFORMATION OF BLOCK INTERLEAVED CODED SIGNAL

(75) Inventors: Sugbong Kang, San Diego, CA (US); Sridhar Ramesh, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 1007 days.

(21) Appl. No.: 12/192,066

(22) Filed: Aug. 14, 2008

(65) Prior Publication Data

US 2009/0052541 A1    Feb. 26, 2009

Related U.S. Application Data

(60) Provisional application No. 60/951,641, filed on Aug. 15, 2007.

(51) Int. Cl.
  *H04N 7/12* (2006.01)
(52) U.S. Cl. ........... 375/240.24; 375/240; 375/240.17; 375/240.26; 375/240.28; 714/752; 714/759; 714/776; 714/784
(58) Field of Classification Search ........... 375/240, 375/240.17, 240.24, 240.25, 240.26, 240.27, 375/240.28; 714/752, 758, 759, 764, 776, 714/779, 784
  See application file for complete search history.

(56) References Cited

U.S. PATENT DOCUMENTS

| | | | |
|---|---|---|---|
| 6,490,705 B1 * | 12/2002 | Boyce | 714/776 |
| 7,346,826 B2 * | 3/2008 | Cucchi et al. | 714/752 |
| 7,447,980 B2 * | 11/2008 | Xu et al. | 714/776 |
| 7,451,378 B2 * | 11/2008 | Gubbi et al. | 714/752 |
| 7,796,600 B2 * | 9/2010 | Chen et al. | 370/392 |
| 7,890,845 B2 * | 2/2011 | Denk et al. | 714/784 |
| 7,987,411 B1 * | 7/2011 | Park et al. | 714/784 |
| 2005/0089309 A1 | 4/2005 | Ando et al. | |
| 2005/0204254 A1 * | 9/2005 | Cucchi et al. | 714/753 |
| 2006/0262810 A1 * | 11/2006 | Vadakital et al. | 370/473 |
| 2006/0282737 A1 | 12/2006 | Shi et al. | |

(Continued)

FOREIGN PATENT DOCUMENTS

KR    2006-0120043    11/2006

(Continued)

OTHER PUBLICATIONS

International Search Report of the International Searching Authority for Application No. PCT/US08/73201, Nov. 3, 2008.

(Continued)

*Primary Examiner* — Ayaz Sheikh
*Assistant Examiner* — Andrew C Lee
(74) *Attorney, Agent, or Firm* — Kilpatrick Townsend & Stockton, LLP

(57) ABSTRACT

Erasure information associated with a received group of encoded and interleaved data in a digital video broadcasting system is stored in a much compacted form. An erasure flag and an address of a last byte associated with the received group of encoded and interleaved data (a record) encapsulated in an MPE-FEC column will be stored in an erasure table. All bytes in the column preceding the last byte of the record will have the same erasure flag as the last byte. Erasure information deinterleaver 524 reads out the content of the erasure table (i.e., the erasure information) in a de-interleaving fashion; and the de-interleaved erasure information 525 are then applied with the de-interleaved coded signals 511 to an FEC decoder 526 to enhance the FEC decoding performance.

30 Claims, 7 Drawing Sheets

U.S. PATENT DOCUMENTS

| | | | |
|---|---|---|---|
| 2006/0282749 A1* | 12/2006 | Guo | 714/776 |
| 2007/0019578 A1 | 1/2007 | Meiri | |
| 2007/0130495 A1* | 6/2007 | Yoon et al. | 714/758 |
| 2007/0180350 A1 | 8/2007 | Choi et al. | |
| 2007/0220406 A1* | 9/2007 | Gubbi et al. | 714/776 |
| 2007/0230387 A1* | 10/2007 | Roh et al. | 370/311 |
| 2007/0240027 A1* | 10/2007 | Vesma et al. | 714/759 |
| 2007/0263623 A1* | 11/2007 | Baek | 370/389 |
| 2008/0052609 A1* | 2/2008 | Peng et al. | 714/799 |
| 2008/0178051 A1* | 7/2008 | Huang | 714/704 |
| 2009/0055715 A1* | 2/2009 | Jashek et al. | 714/776 |
| 2009/0259920 A1* | 10/2009 | Guo et al. | 714/776 |
| 2010/0050052 A1* | 2/2010 | Guo | 714/764 |
| 2010/0115379 A1* | 5/2010 | Gubbi et al. | 714/776 |
| 2010/0131822 A1* | 5/2010 | Villion | 714/758 |
| 2010/0235706 A1* | 9/2010 | Eberlein et al. | 714/752 |

FOREIGN PATENT DOCUMENTS

| | | |
|---|---|---|
| WO | WO 2005/030534 A2 | 4/2005 |
| WO | WO 2009-023789 A1 | 2/2009 |

OTHER PUBLICATIONS

Written Opinion of the International Searching Authority for Application No. PCT/US08/73201, Nov. 3, 2008.

Office Action for Korean Patent Application No. 10-2010-7004693, mailed on Jun. 23, 2011, 6 pages.

Notice of International Preliminary Report on Patentability for PCT/US2008/073201, mailed on Feb. 16, 2010, 11 pages.

\* cited by examiner

METHOD AND APPARATUS FOR PRESERVING DEINTERLEAVING ERASURE INFORMATION OF BLOCK INTERLEAVED CODED SIGNAL

CROSS-REFERENCES TO RELATED APPLICATIONS

The present application claims benefit under 35 USC 119 (e) of the U.S. provisional application No. 60/951,641, filed Aug. 15, 2007, entitled "Method and Apparatus for Preserving Deinterleaving Erasure Information of Block Interleaved Coded Signal", the content of which is incorporated herein by reference in its entirety.

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention relates to a method and apparatus for processing erasure information in a digital broadcasting system, and in particular, to a method and apparatus for storing and de-interleaving erasure information in a digital video broadcasting (DVB) system.

The MPEG (Motion Pictures Expert Group) standard focuses on the encoding and transport of video and audio data. In general, the MPEG standard uses compression algorithms to reduce the number of bytes to be transmitted and/or stored without noticeably affecting the quality of the original video and audio content.

The International Organization for Standardization (referred to as the ISO/IEC hereinafter) has developed the MPEG-2 standard for the coding of moving pictures and associated audio. The MPEG-2 standard is set forth in four documents. The document ISO/IEC 13818-1 (systems) specifies the system coding of the specification. It defines a multiplexed structure for combining video and audio data and includes timing information necessary to synchronously replay sequences of the video and associated audio. The document ISO/IEC 13818-2 (video) specifies the coded representation of video data and the decoding process required to reconstruct the pictures. The document ISO/IEC 13818-3 (audio) specifies the coded representation of audio data and the decoding process required to reconstruct the sound. And document ISO/IEC 13818-4 (conformance) specifies procedures for determining the characteristics of coded streams and for testing compliance with the requirements set forth in the documents ISO/IEC 13818-1, 13818-2, and 13818-3.

The MPEG-2 standard provides a packet based encoding and transport of multimedia data, wherein video, audio, other data are multiplexed into a bit stream. The bit stream is then segmented into a packetized elementary stream (PES), and then respective packets are multiplexed into either of two distinct streams: a transport stream (TS) or a program stream (PS). A transport stream consists of packets of fixed length (188 bytes) whereas a program stream comprises a multiplex of variable length PES packets. Transport stream is used in the digital video broadcasting (DVB) system whereas program stream is used in error free environments, such as recording programs on digital versatile disc (DVD). The PES is a data structure used to carry elementary stream data. An elementary stream (ES) is either one of coded video, coded audio, or other coded data streams carried in a sequence of PES packets with only one packet identifier (PID).

Transport Stream (TS) packets are used in video broadcasting, where the transmission channel is noisy and facing multiple impairments such as multipath fading, group delay variation, Doppler effect due to a receiver moving in relation to a broadcast station, carrier frequency offset caused by local oscillator drift, carrier phase noise, carrier amplitude imbalance, channel bandwidth aberrations caused by unintentionally filtering, etc.

In contrast to other DVB transmission systems, which are based on the DVB Transport Stream (TS) adopted from the MPEG-2 standard, the DVB-H is the specification for broadcasting services to handheld receivers, and was formally adopted as an ETSI (European Telecommunications Standards Institute) standard in November 2004. More specifically, DVB-H is a digital TV standard for mobile applications that mandates power savings and allows receivers to move freely while receiving services. DVB-H is based on the Internet Protocol (IP). In consequence, the DVB-H baseband interface is an IP interface format. This interface allows the DVB-H system to be combined with other IP-based networks. This combination is one feature of the IP datacast system. The MPEG-2 TS is still used by the link data layer. Encoded multimedia data are mapped into variable length IP packets called IP datagrams. The IP datagrams are encapsulated into the transport stream by means of the multi-protocol encapsulation (MPE), an adaptation protocol defined in the DVB Data Broadcast Specification ETSI EN 301,192.

On the level of the MPE, an additional stage of forward error correction (FEC) is added. This technique, called MPE-FEC, is one of the main innovation of DVB-H. MPE-FEC complements the physical layer FEC of the underlying DVB-T standard. It is intended to lower the signal-to-noise (SNR) requirements for reception by a hand-held device in mobile environment.

The MPE-FC processing is located on the link layer at the level of the JP input streams before they are encapsulated by means of the MPE. FIG. 1A is a block diagram of a DVB-H transmitter including the DVB-H codec that comprises the MPE-FEC, the MPE, and a time slicing technique. The time-slicing technique is a power saving feature of the DVB-H system that assigns transmitted programs in time slices, hence, allows a receiver to be active only at the period of interest to receive a burst of data and then powered down for the rest of power-save period. The IP input streams provided by different sources as individual elementary streams are multiplexed according to the time slicing method. The output of a single MPEG audio or video coder is called an Elementary Stream (ES). The MPE-FEC error protection is calculated separately for each individual elementary stream.

IP diagrams are encapsulated into MPE sections. MPE sections are further protected with a forward error correcting (FEC) code. A Reed-Solomon code RS(255, 191, 64) code is used for data reliability enhancement and forms the FEC sections. The IP input streams provided by different sources as individual elementary streams (ES) are multiplexed according to the time slicing method. Video programs are encoded into MPEG-2 formats, the encoded data are then packetized and multiplexed with the MPE-FEC sections to form transport stream (TS) packets. The DVB-H coder 101 comprises a DVB-T coder and modulator compatible with the DVB-T standard in the physical layer with added support of a 4K mode and transmitter parameter signaling (TPS) for the DVB-H transmission. FIG. 1B shows a prior art block diagram of a DVB-H receiver. The receiver 120 includes DVB-H demodulator 122 that recovers the MPEG-2 transport stream (TS) packets. TS packets 124 are then applied to DVB-H IP-decapsulator 130 that includes time slicing module 134. Timing slicing module 134 controls the receiver to decode the wanted service and shut off during the other services. It aims to reduce receiver power consumption. MPE-FEC module 136 offers a complementary FEC function that allows the receiver 120 to cope with particular difficult reception situations.

A transport stream packet can carry many different programs and each may use a different compression factor and a bit rate that can change dynamically though the overall bit rate stays constant (statistical multiplexing).

The DVB standard specifies that IP datagrams are carried in an MPEG-2 TS through the multiprotocol encapsulation (MPE). FIG. 2 shows that each IP datagram 201 is encapsulated into MPE 210. MPE 210 is in turn encapsulated into MPE sections 232. A stream of MPE sections is then put into an elementary stream (ES), i.e., a stream of MPEG-2 TS packets with a particular program identifier (PID). Each MPE section has a 12-byte header 231, a payload 232, and a 4-byte cyclic redundancy check (CRC-32) tail 233. The total payload length is identical to the length of the IP datagram.

MPE 210 comprises a number of rows 212 and a number of columns 214. The number of columns corresponds to 191 bytes, and the number of rows is equal to 256, 512, 768, or 1024. Each row of 191 bytes is further protected by a Reed-Solomon (RS) code, which produces additionally 64 RS-parity bytes for the MPE-FEC 221. Therefore, the MPE-FEC encoder creates a specific frame structure called the FEC frame, incorporating the IP datagrams 201. The FEC frame consists of a maximum of 1024 rows and a constant number of 255 columns, for a maximum of 261,120 bytes. The MPE data are encapsulated into a number of MPE sections 232, and the RS data are encapsulated into a number of MPE-FEC sections 242. MPE-FEC sections 242 are sent immediately after the last MPE section, in the same ES, but with different table_id than the MPE sections. The use of two different table_ids enables the receiver to discriminate between the two types of sections.

The number of rows in the MPE-FEC frame is signaled in the service information and may take any of the values 256, 512, 768, or 1024. The number of columns is 191 for the application data table (ADT) and 64 for the RS data table 221. The IP datagrams of a particular burst are introduced vertically column-by-column in the ADT, starting at the upper left corner. If an IP datagram does not end exactly at the bottom of a column, the remaining bytes continue from the top of the next column. If the IP datagrams do not exactly fill the ADT, the remaining byte positions are padded with zeroes (zero padding 217). On each row the 64 parity bytes of the RS data table 221 are calculated from the 191 IP datagram bytes (and padding bytes, if application) of the same row, using the Reed-Solomon code RS(255, 191, 64).

Headers 231 of MPE sections 232 and headers 241 of MPE-FEC sections 242 contain a 4-byte real time parameter field, which include a 12-bit start address, which indicates the byte number (counted from the start of the ADT table) of the start position of the corresponding IP datagram or RS column, as well as the 18-bit delta_t parameter and 1-bit table boundary flag and frame boundary flag to signal end-of-table and end-of-frame.

FIG. 3 illustrates multiple transport stream packets 300 of 188 bytes, each packet including a header 301 and a payload 302. Each header 301 includes an eight (8) bit sync byte field 310, a one (1) bit transport error indicator field 311, a one (1) bit payload unit start indicator field 312, a one (1) bit transport priority field 313, a thirteen (13) bit packet identifier field 314, a two (2) bit transport scrambling control field 315, a two (2) bit adaptation field control field 316, a four (4) bit continuity counter field 317, and an optional adaptation field 318. Each of these fields is described in the MPEG-2 standard. For the interest of the reader a short description of each field is given in sections below.

The sync byte 310 has a binary pattern of "01000111" (0x47) and identifies the start of a transport stream (TS) packet. The transport error indicator (TEI) field 311 is set if the error correction layer above the transport layer is experiencing a bit error rate (BER) that is too high to be correctable. When set to '1', TEI may indicate that the packet may contain error. The payload unit start indicator (PUSI) field 312 indicates whether the TS packet carries the start of a new payload (PUSI="1") or the TS packet does not carry the start of a new payload (PUSI="0"). The packet identifier (PID) field 314 indicates the type of data carried in the payload 502. Certain PID values are reserved.

The continuity counter (CC) field 317 counts the number of consecutive TS packets having the same PID field 314 value. The four-bit continuity counter field 317 is used to help with detecting broadcast errors. The counter typically runs from 0 to 0xF and then restarts at 0 again. The next packet in the stream having the same PID will have the continuity counter field incremented by one. In this way the continuity counter runs in a continuous sequence within all packets of the same PID. However, the continuity sequence for packets with a different PID will be different.

All these header fields can be used by a receiver to make a DVB-H reception more robust. The reception can even be made more robust when using an error protection technique. FIG. 4 is a block diagram of a concatenated forward error correcting (FEC) coding scheme used in the DVB-H transmitter. The concatenated FEC includes, in part, an outer FEC coder 410, which is a Reed-Solomon encoder. Source data, consisting of video, audio, and data, is multiplexing into transport stream packets 405. Each packet is 188 bytes long with 184 bytes for data and 4 bytes for header, such as sync, packet ID, transport error indicator (TEI), etc. The FEC outer encoder 410 uses a RS block code (n, k), where n is the block size and k the number of information symbols. The RS encoded symbols is then applied to a block interleaver 412. The purpose of the block interleaver is to spread burst errors across several data packets and improve the BER performance by making it easier for an RS decoder to correct errors. The interleaved and encoded symbols are further passed to an inner FEC encoder 414.

Erasure decoding can improve the error correcting capability compared to decoding without erasure information. For example, an (n, k) RS decoder can correct up to (n−k) erasures when erasure is used, where erasure indicates coded symbol value is in doubt. Any e symbol errors and f erasures can be corrected by erasure decoding provided that $f+2e \leq n-k$. However, when erasure is not used during decoding, up to (n−k)/2 errors can be corrected.

In a DVB-H standard, when a two-stage decoding is used, the first stage is typically adapted to correct up to 8 bytes of errors. The second stage is typically adapted to correct up to 32 bytes of errors when no erasure information is available, and up to 64 bytes of erasures when erasure information is available. The first decoder supplies both the decoded data as well as the erasure information to the second decoder. The first and second decoders may be Reed-Solomon (RS) decoders adapted to decode at different decoding rates. When interleaving is used, a deinterleaver is also used to deinterleave the data decoded by the first decoder. Accordingly, both the data decoded by the first decoder as well as the erasure information are first stored in a memory accessible to the deinterleaver.

Erasure may be detected from various methods. For example, in Digital Video (DVB) systems, erasure may be detected from CRC test for each received IP sections, or from physical layer RS decoder for each received Transmission Stream (TS) packets. In this case, the erasure information is provided per IP section or per TS packets. As described above, erasure information also needs to be deinterleaved unless erasure is detected from deinterleaved symbols.

For a block interleaved coded system, a block deinterleaver may be implemented as a matrix with R number of rows, also known as interleaver depth, and C number of columns, also known as interleaver span. Symbols are filled from the top to the bottom of a column starting from the first column to the next columns. Deinterleaved symbols are read from the first column to the following columns of a row starting from the first row, followed by the succeeding rows. This straightforward and most common implementation requires m×R×C bits of memory space, where m is the number of bits for each symbol, R is the number of rows and C is the number of columns of the block deinterleaver.

When the block interleaver depth and interleaver span are large, the block deinterleaver requires large amount of memory. A need therefore exists for an improved block deinterleaver which requires a smaller amount of memory space.

BRIEF SUMMARY OF THE INVENTION

The present invention provides a method and apparatus for preserving erasure information to improve error correction in a block interleaved coding system. In accordance with one embodiment of the invention, one or more erasure tables are used to store erasure information. Each erasure table includes a multitude of records each of which maintains erasure information for one or more groups of data symbols (hereinafter also referred to as data), such as packets. Each record also includes the last address associated with the group(s) of data represented by the same erasure information. Each column may have a fixed number of records N. Assume, for example, that data bytes 1-1000 are detected as being valid data. Accordingly, the same erasure bits, e.g. 0, is used to represent these bytes. The address associated with byte number 1,000 is also stored. The present invention is applicable to all devices which implement block interleaved coding schemes, such as digital video broadcast (DVB-H).

In one embodiment of the present invention, a method for preserving erasure information can be divided into a write operation process and a read operation process. The write operation process comprises: receiving a data stream having multiple groups of encoded data; obtaining an erasure information from each received group of encoded data; comparing the erasure information with a reference value; and generating a record including, in part, the erasure information and an address, which is associated with the last byte of a group in a column and updating the reference value if the erasure information is not equal the reference value; and storing the record at a location in an erasure table. The method further comprises comparing the address with an end-of-column value; determining if more records are required when the reference value is equal the end-of-column value; and generating records if the determining of more records is positive. The method further comprises the read operation process, which includes the steps of retrieving erasure information from the erasure table. The retrieving of erasure comprises: (a) accessing a record of a column in the erasure table; (b) retrieving an erasure information from the record if a current row associated with the record is not the same as a row accessed during the last accessing; (c) accessing a next record if the current row is the same as the row accessed during the last accessing; (d) and going back to (b) until a last record associated with a last row is accessed and the associated erasure information is retrieved.

In another embodiment of the present invention, a device of detecting, storing, and de-interleaving erasure information in a block interleaved coding system is disclosed. The device includes, in part, a block deinterleaver adapted to de-interleave multiple groups of encoded data and output a number of blocks of de-interleaved encoded data, an erasure detector connected to an erasure table, which is in turn coupled to an erasure information deinterleaver. The erasure information deinterleaver may read the erasure information stored in the erasure table according to the read operation process described in the method section above. The erasure information deinterleaver may further be connected to an FEC decoder, which receives the number of blocks of de-interleaved encoded data together with de-interleaved erasure information of the erasure information deinterleaver to perform a decoding operation. The erasure detector may perform the write operation process described in the method section above. In one embodiment of the present invention, the erasure table may be a static random access memory (SRAM).

The following detailed description together with the accompanying drawings will provide a better understanding of the nature and advantage of the present invention.

DETAILED DESCRIPTION OF THE INVENTION

Erasures are errors, whose location in codevector is known, but whose magnitude is unknown. An erasure might be logical '0', i.e., no error at all; it might be logical '1', i.e., data is erroneous. For any error correcting code (ECC), the use of erasure information greatly enhances decoding. Erasure information in each record may be represented by n1 bits. The variable n1 can be used for number of bits, but it can also be used as erasure itself. For example, in one embodiment, n1 may be equal to 1. In one embodiment, erasure information may be set to "0" when the group of data corresponding to the erasure information is received correctly; erasure information may be set to "1" when the group of data corresponding to the erasure information is not received correctly. As described above, the FEC outer encoder is a RS block encoder RS (n, k), where n is the block size and k the number of information symbols. For example, n=255 and k=239 symbols. In DVB-H, RS codes use $2^8$ symbols, hence, each symbol can be represented by 8 bits (a byte). As the TS packets are only 188 byte long, the first 51 bytes are set to zero and not transmitted. Therefore, a shortened RS (204, 188) code is used for the transport stream (TS) packets. When shortened code is used, the fields corresponding to punctured columns may be set as erroneous, and the fields corresponding to padded columns may be set as no error.

Figure 3:
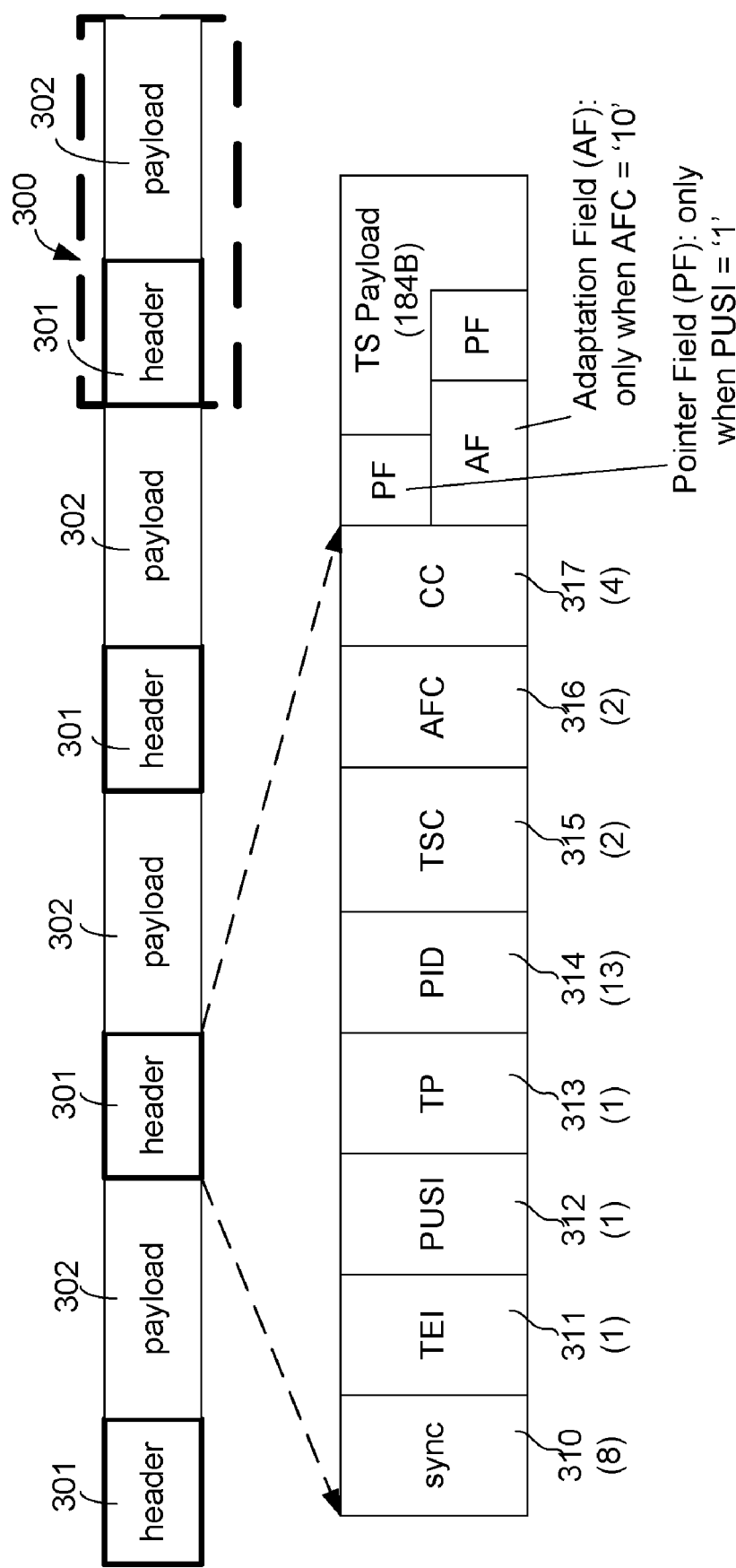
FIG. 3 is a block diagram illustrating the header of a TS packet in accordance with the MPEG standard.
Figure 4:
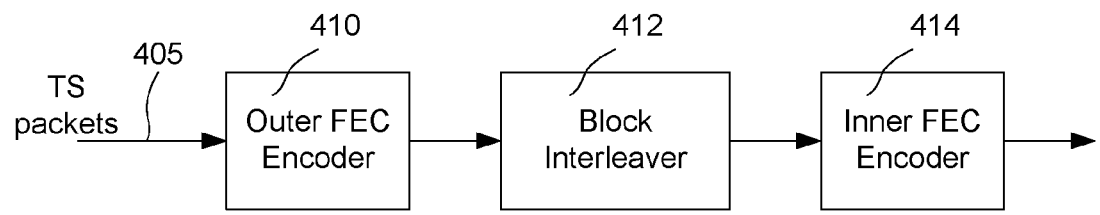
FIG. 4 is a block diagram of a concatenated forward error correcting scheme used in a DVB-H transmitter, as known in the prior art.

TS packets decoding may be based on the transport error indicator (TEI) in the TS packet header. The TE indicator 311 (FIG. 3) is a one bit flag that is set to '1' if the physical layer RS(204, 188) decoder is unable to decode the TS packet. RS(204, 188) decoder can correct up to 8 erroneous bytes in each TS packet with 16 redundancy bytes. Therefore, RS(204, 188) decoder outputs received symbols as valid symbols if there are no more than 8 errors. Otherwise, the decoder is not able to correct errors and may declare the received symbols invalid.

TS packets, whose TEI='1', may be considered erasures. Other erasures can be TS packets, whose 13 bit packet identifier (PID) is incorrect and the TS packets cannot be recognized as part of the data streams, hence, considered 'lost' packets. In consequence, only correct TS packets are considered correct data, all other packets having incorrect PID, TEI='1' or more than 8 byte errors are erasures.

As noted above, erasure information can be gathered, for example, from TS packet headers. This is performed via the physical layer RS(204, 188). If the total number of erroneous bytes in a 204 byte group of encoded data is smaller than 8, the RS decoder of the receiver will correct all of them. Otherwise, the physical layer RS decoder will flag a decode fail signal (e.g, by means of the TEI flag) and mark all of the 188 bytes as erasures. This requires 255 Kbit storage memory space, which adds to hardware complexity and cost (silicon area and test time). An enormous savings with regards to prior art implementation can be achieved according to one embodiment of the present invention.

Assume that a lower layer, such as the physical layer, of a system detects a group of data as being corrupted (also referred to as bad). An upper layer, such as the link layer, may analyze the same group of data and decide that this data is not "bad" and instead classifies this data as "may not be totally bad" data. Here again, the variable n1 may be defined as the number of bits, but can also be used as erasure information. In such instances, n1 can be greater than 1. For example, erasure information may be set to "11" when the group of data corresponding to the erasure information is considered as being bad data; erasure information may be set to "00" when the group of data symbols corresponding to the erasure information is considered as being valid (also referred to as good); and erasure information may be set to "01" or "10" when the group of data symbols corresponding to the erasure information is considered as "may not be totally bad". Accordingly, when multi-level erasure information is used, erasure information is represented by more than 1 bit.

Each column of the erasure data corresponds to a column of the memory. Assume that the last address in each record (each record being associated with a group of data classified as either "bad" or "good" or "may not be totally bad") is represented by n2 bits. Assume that n2 specifies the column-wise address of the last byte to which the erasure information of the record is associated with. In one embodiment of the invention, address 0 corresponds to the first byte of a column. When the same erasure information of a record is applicable to the end of the column, the last address of the record is set to R−1, where R represents the number of rows, also known as the interleaver depth. Therefore, in accordance with one embodiment of the present invention, (n1+n2)×N×C bits of memory space is used to store the erasure information, where C represents the number of columns and N the number of records per column.

The following examples shows a comparison of the amount of memory space used by the present invention in a DVB-H system compared to that used by a matrix based implementation, known in the prior art. In accordance with the DVB-H standard, when erasure decoding is performed by the RS decoder disposed in the physical layer, one erasure bit is used for every 184 bytes, which is the size of the packet used in this standard. In a matrix based implementation, 31.9 Kbytes (K=$2^{10}$=1024) of memory space are required, as calculated below:

1 bit×1024 rows×255 columns=255 Kbit=31.875 Kbyte

The 1 bit used for the calculation assumes that all bytes in the packet are classified as being either "good" or "bad". The maximum number of bytes that may be written to each column of the MPE-FEC is 1024. In one embodiment of the present invention, an erasure table of much compacter form may be used. For the DVB-H standard, a maximum of 8 (1024/184<8) records is sufficient to store the erasure information associated with the bytes that are stored in each column. If n1 is set to 1, and n2 is set to 10 (for the worse case where the MPE-FEC has 1024 rows), only 2.739 Kbytes of memory space are required to store erasure data, as calculated below.

11 bit×8 records×255 columns=2.739 KByte

Figure 1A:
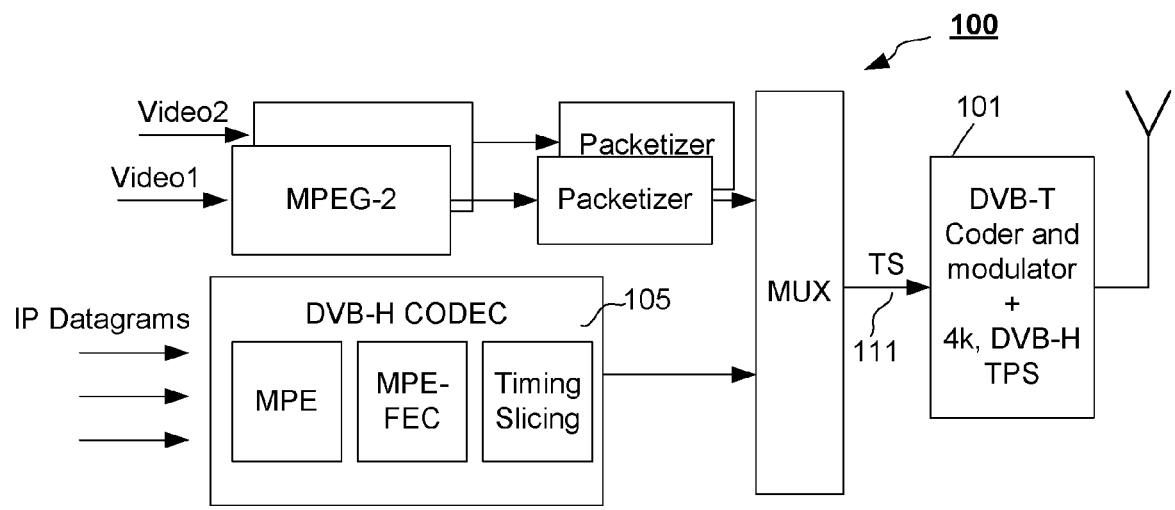
FIG. 1A is a block diagram of a DVB-H transmitter, as known in the prior art.
Figure 1B:
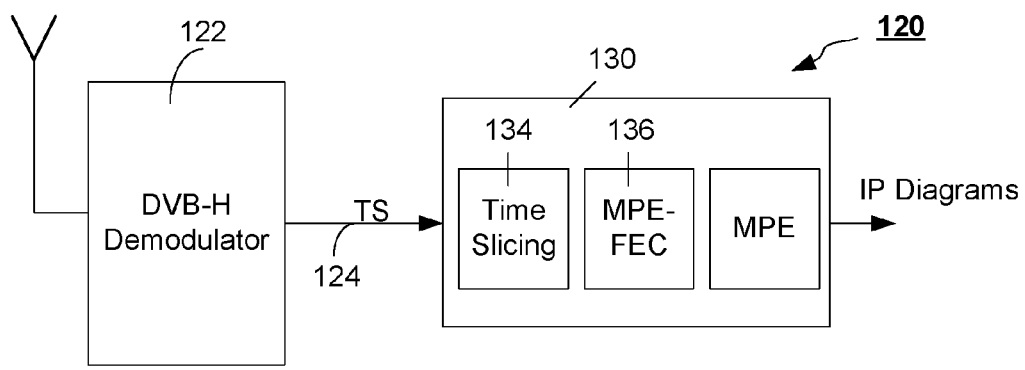
FIG. 1B is block diagram of a DVB-H receiver, as known in the prior art.
Figure 2:
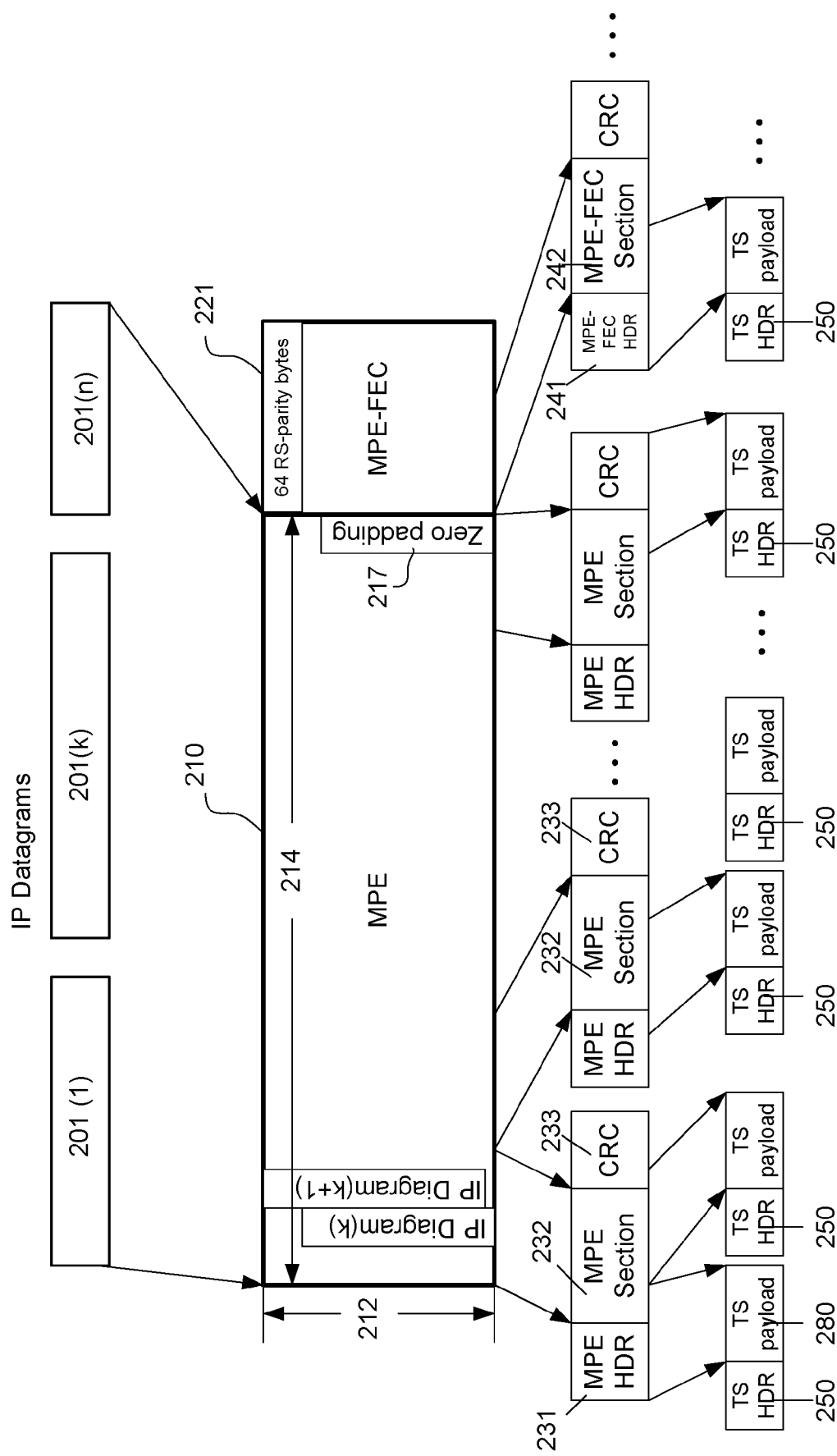
FIG. 2 shows encapsulation of IP diagrams in transport stream packets through an MPE frame, as known in the prior art.

In consequence, the erasure table can be a storage matrix of N number of rows (where N is the number of records and is fixed for a given MPE-FEC) by C number of columns, where C is decimal 255 in the MPE-FEC frame (FIG. 2). In this example, the present invention requires less than 8.6 percent of memory space used by a matrix-based system as known in the prior art. As is understood, in this example, the data disposed in each 184 bytes of a packet is classified as being "good" or "bad". Within each packet, the individual bytes of data are classified equally.

Figure 5:
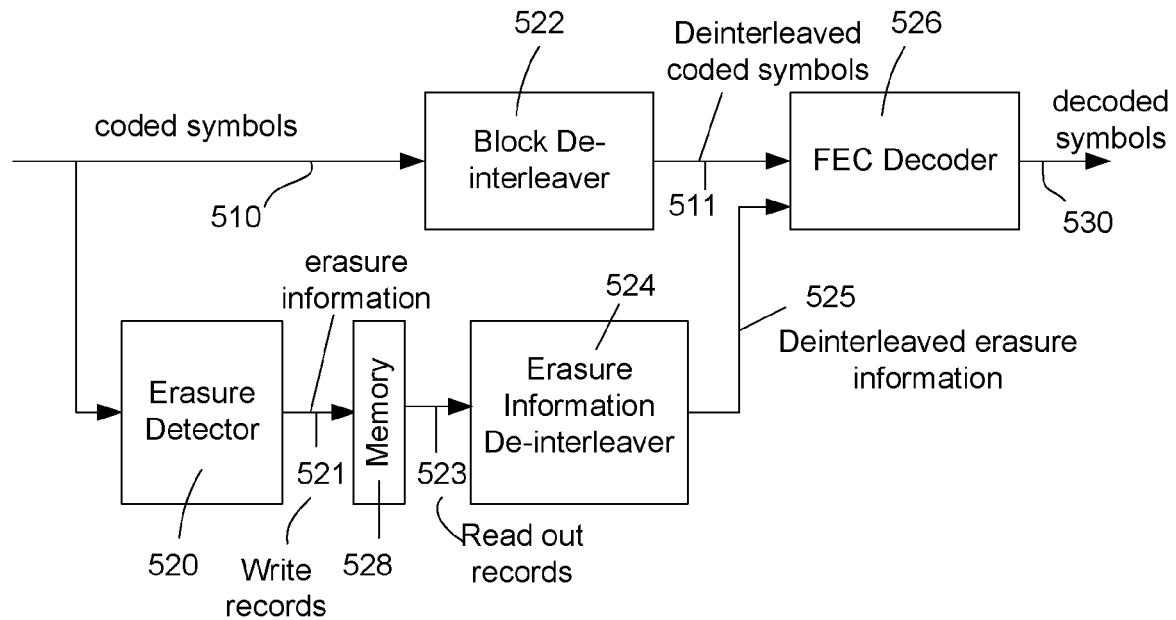
FIG. 5 is a block diagram illustrating a a receiver for detecting, preserving and deinterleaving erasure information, in accordance with one embodiment of the present invention.

FIG. 5 is a block diagram illustrating a number of blocks disposed in a receiver of a wireless system using a block interleaved coding technique, in accordance with one embodiment of the present invention. Coded symbols 510 are applied to block deinterleaver 522 and erasure detector 520. Block deinterleaver 522 deinterleaves the coded symbols and thereafter supplies the deinterleaved coded symbols to FEC decoder 526. Erasure detector 520 extracts erasure information from the received coded symbols 510 and supplies the extracted erasure information to erasure information deinterleaver 524. In one embodiment of the invention, code symbols 510 are grouped into multiple groups of encoded symbols (data). Each one of the groups may include a header and a payload conforming to a transport stream (TS) packet specified in the MPEG standard. The number of symbols (bytes or data) in a column is a system parameter received by a receiver over the air. The number of data in a column may be one of 256, 512, 768, or 1024. Erasure detector 520 determines an address of the last byte of a group of encoded data in a column and combines it with the extracted erasure information to generate a record. The erasure information may be n1 bit(s) and the address of the last byte associated with the group of encoded data (e.g., a TS packet) may be n2 bits, n2 having the maximum value 10 for the worst case where the MPE-FEC contains 1024 rows. Therefore, a record associated with a group of encoded data would have a word size of 11 bits if n1 is 1 bit and n2 is 10 bits. These records will be written into an erasure table (memory 528) through link 521. Memory 528 is also coupled to erasure information de-interleaver 524 via link 523. Erasure information are read out by deinterleaver 524, which deinterleaves the erasure information and supplies deinterleaved erasure information to FEC decoder 526. FEC decoder 526, in response, supplies decoded symbols 530.

Figure 6:
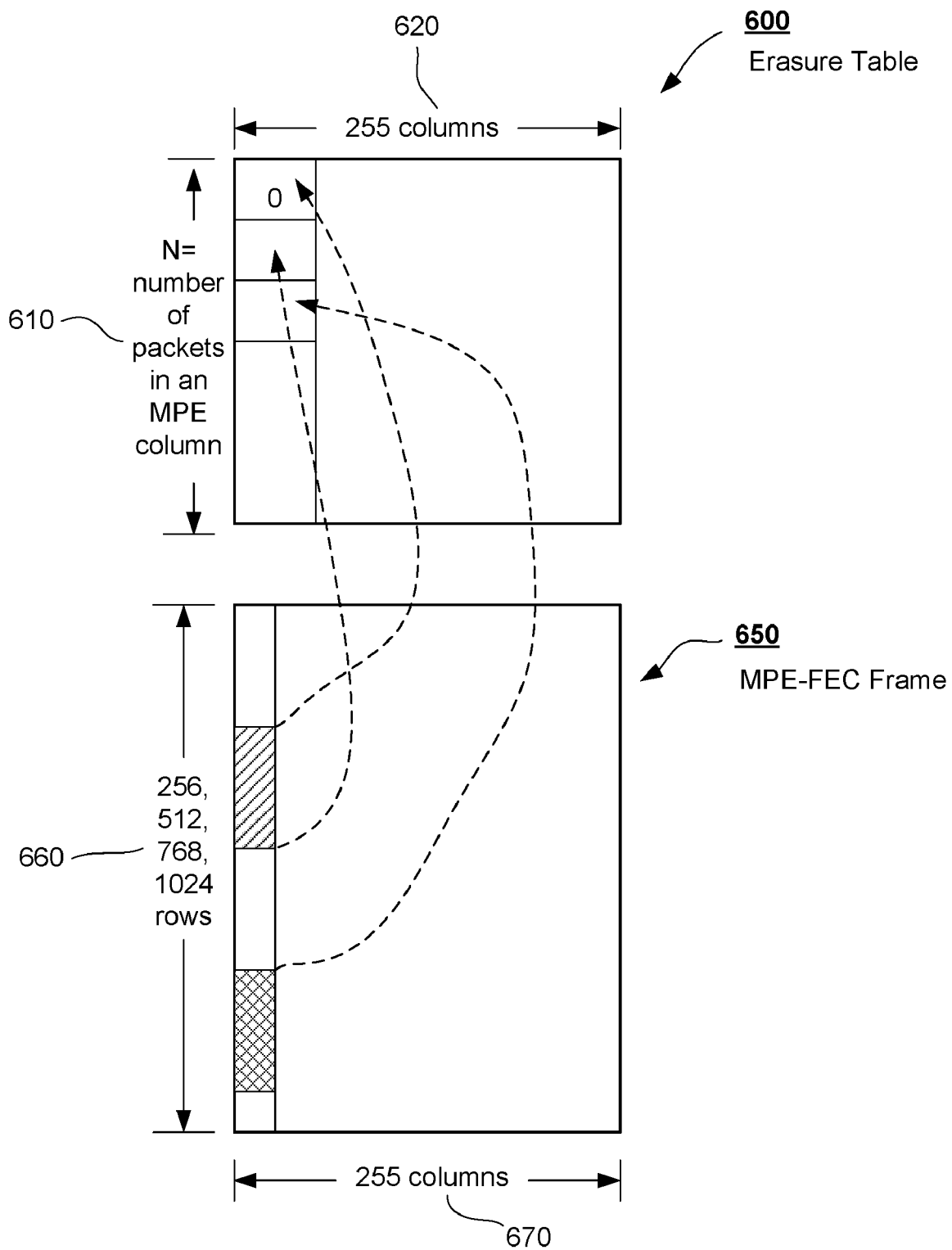
FIG. 6 is an exemplary block diagram of an erasure table in accordance with one embodiment of the present invention.

FIG. 6 is a block diagram of an exemplary erasure table in accordance with one embodiment of the present invention. Instead of storing all erasures as required in a prior art matrix-based system, only records of word size (n1+n2) bits need to be stored. The de-interleaving method requires a very low memory space, in accordance with one embodiment of the present invention. Erasure table 600, which corresponds to memory 528, can be a storage memory module of N rows 610 and C number of columns 620 for a total of N×C memory cells, each memory cell having a word size of (n1+n2) bits. In one embodiment, n1 can be the 1 bit TEI flag indicating whether all bytes within an associated group are either "valid" or "bad", and n2 is the address of the last byte of an associated group of data encapsulated in a column 670 of MPE-FEC frame 650. The MPE-FEC frame 650 is an MPE matrix of a number of rows 660 by a number of columns 670. The maximum number of rows 660 is 1024. Each row 660 contains an RS codeword. Each codeword contains 64 bytes of syndrome. As the maximum number of rows is 1024, n2 will be 10 bits. In this case, only one memory cell of 11 bits will be needed to store erasures of all bytes in a TS packet. The 1-bit n1 represents the erasure information (valid or bad) of all bytes associated with a group which is identified by the address of its last byte in a column. In another embodiment of the invention, n1 may be 2 bits indicating that all bytes of TS packet may be "good" (valid), "bad" (erroneous), or "may not be totally bad". In this case, erasure table 600 may have a word size of 12 bits for each erasure information associated with a TS packet (e.g., group of encoded data). The erasure table 600 may be implemented as a static random access memory (SRAM), which can be external to block deinterleaver 524 or integrated with the erasure information de-interleaver 524 as its size is very compact according to one embodiment of the present invention.

Figure 7:
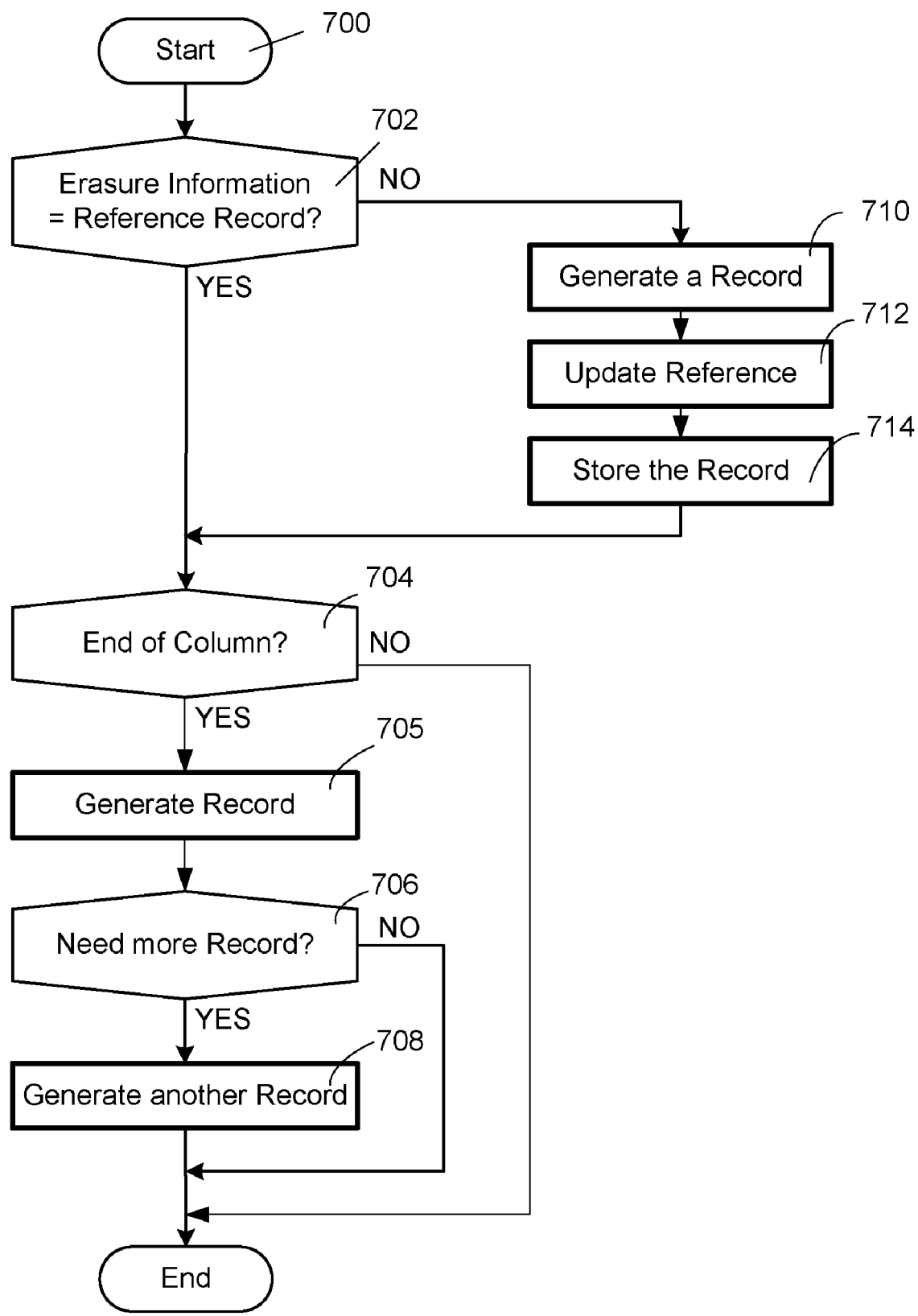
FIG. 7 shows a flowchart illustrating a method of writing erasure information to an erasure table in accordance with one embodiment of the present invention.

FIG. 7 is a flowchart of steps performed to carry out a write operation of erasure information to an erasure table, in accordance with one embodiment of the present invention. This operation is to write erasure information for data, which correspond to index (Row, Column) of the MPE matrix. After the write operation starts at step 700, if the erasure information for a new group of received data is the same as the one in the current record (reference record) of the same column at step 702, a check is made to see if the end of the column has been reached at step 704. The end of column is a value corresponding to the number of rows in the MPE frame, which is a system parameter received by a receiver over the air. If the end of the column has been reached at step 704, a record is generated at step 705 and determination is made as to whether more record is needed at step 706. If the answer is no, the process ends; and if the answer is yes, another record at step 708 is generated. If the erasure information for a new group of received data is not the same as the one in the reference record of the same column at step 702, a new record is generated at step 710, the reference record is updated at step 712, and the new record is stored in the erasure table at step 714.

Figure 8:
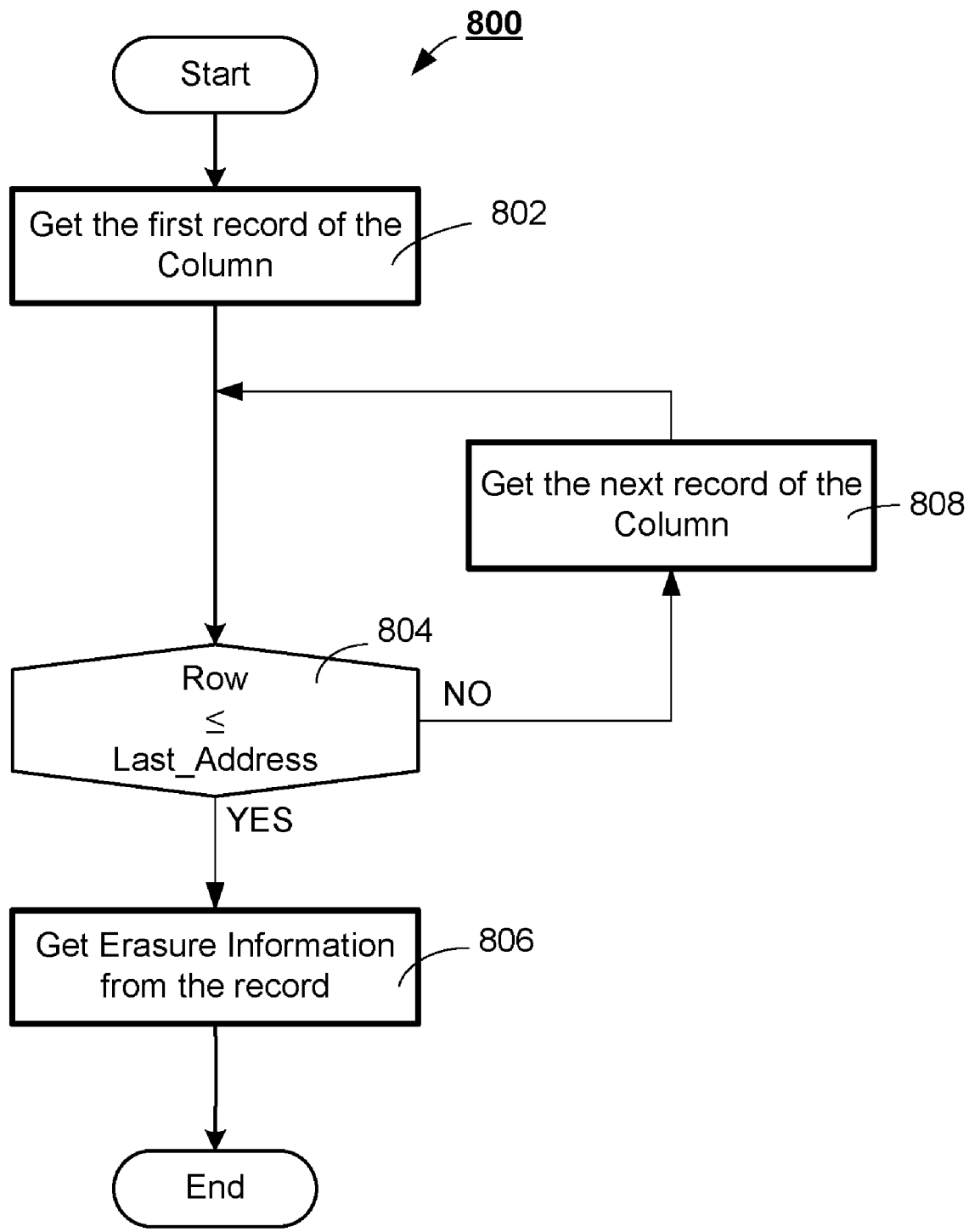
FIG. 8 shows a flowchart illustrating a method of reading erasure information from an erasure table in accordance with one embodiment of the present invention.

FIG. 8 is a flowchart of steps performed to carry out a read operation from an erasure table, in accordance with one embodiment of the present invention. The operation 800 is to get erasure information for data, which correspond to index (Row, Column) of the MPE matrix in a fashion to de-interleave the erasure information. The first record of the column is retrieved at step 802. Next, if the current row index is smaller than the address field of the record accessed from the last erasure readout cycle at step 804, erasure information is retrieved from the record at step 806. If the current row index is not smaller than the address field of the record accessed during the last erasure readout cycle at step 804, the next record at step 808 associated with the column is obtained and the process moves to step 804, as described above.

While the invention has been described with respect to exemplary embodiments, one skilled in the art will recognize that numerous modifications are possible. For example, the process described herein may be implemented using hardware components, software components, and/or any combination thereof. The specification and drawings are, accordingly, to be regarded in an illustrative rather a restrictive sense. It will, however, be evident that various modifications and changes may be made thereunto without departing from the broader spirit and scope of the invention as set forth in the claims and that the invention is intended to cover all modifications and equivalents within the scope of the following claims.

What is claimed is:

1. A method for preserving erasure information in a block interleaved coding system comprising:
receiving a plurality of groups of coded data;
obtaining erasure information associated with a first one of the plurality of groups of coded data;
comparing the erasure information with a reference value to determine if a match exists;
in the event that no match exists:
generating a first record including a first address and the erasure information; and
storing the first record at a location in an erasure table.

2. The method of claim 1, wherein each one of the plurality of groups of coded data is a transport stream (TS) packet including a header having a plurality of fields and a payload in accordance with an MPEG standard.

3. The method of claim 2, wherein the erasure information is one of the plurality of fields in the header of the TS packet.

4. The method of claim 1, wherein the erasure information comprises one or more bits.

5. The method of claim 4 further comprising updating the reference value by replacing it with the erasure information.

6. The method of claim 1 further comprising:
determining if an end of the column is reached;
generating a new record if the end of the column is reached.

7. The method of claim 1, wherein the erasure table comprises a storage memory module having a matrix of N by C storage cells, wherein N and C are integers.

8. The method of claim 7, wherein the storage memory module is a static random access memory (SRAM).

9. The method of claim 7, wherein C corresponds to a number of columns in an MPE-FEC frame specified in a DVB-H standard.

10. The method of claim 7, wherein N corresponds to a positive integer of a division result of a number of rows in the MPE-FEC frame by a payload length of a transport stream (TS) packet.

11. The method of claim 10, wherein the number of rows in the MPE-FEC frame is one of decimal values 256, 512, 768, or 1024.

12. The method of claim 10, wherein N is equal to or less than eight (8).

13. The method of claim 1 further comprising retrieving erasure information from the erasure table.

14. The method of claim 13, wherein the retrieving of erasure information comprises:
   accessing a record of a column in the erasure table, the record including a row index;
   retrieving an erasure information from the record if the row index is smaller than an address field accessed during a preceding access;
   accessing a next record if the row index is not smaller than the address field accessed during the preceding access; and
   repeating the retrieving and accessing operations until a last record associated with a last row is accessed and the associated erasure information is retrieved.

15. The decoder of claim 1, wherein the first address is an address of a last byte of the first one of the plurality of groups of encoded data in a column.

16. A decoder comprising:
   a block deinterleaver adapted to de-interleave a plurality of groups of encoded data and output a plurality of blocks of de-interleaved encoded data;
   an erasure detector adapted to:
      receive the plurality of groups of encoded data;
      obtain erasure information of a first one of the plurality of groups of encoded data; and
      generate a first record including a first address and the erasure information in response to the obtained erasure information; and
   an erasure table adapted to store the first record.

17. The decoder of claim 16, wherein each one of the plurality of groups of encoded data is a transport stream (TS) packet having a header and a payload in accordance with an MPEG standard.

18. The decoder of claim 16, wherein the erasure detector is adapted to generate a new record-if an end of column is reached.

19. The decoder of claim 16, wherein the erasure detector parses an indicator field and determines an address of a last-byte associated with a group of encoded data in a column of an MPE-FEC frame.

20. The decoder of claim 19, wherein the indicator field is a binary flag adapted to represent an erasure information for all encoded data encapsulated in the group, the group being identifiable by the address of the last byte in the column of the MPE-FEC frame.

21. The decoder of claims 19 wherein the erasure detector generates a record comprising the erasure information and the address of the last byte of the associated group in the column of the MPE-FEC frame.

22. The decoder of 21, wherein the record is stored in the erasure table.

23. The decoder of claim 16, wherein the erasure table comprises a storage memory module having a matrix of N by C of memory cells, wherein N and C are integers.

24. The decoder of claim 23, wherein C corresponds to a number of columns in an MPE-FEC frame specified in a DVB-H standard.

25. The decoder of claim 23, wherein N corresponds to an integer of a division result of a number of rows in the MPE-FEC frame by a payload length of a transport stream packet.

26. The decoder of claim 25, wherein the number of rows is one of decimal values 256, 512, 768, or 1024.

27. The decoder of claim 16, wherein the erasure table is a static random access memory (SRAM).

28. The decoder of claim 16 further comprising:
   an erasure information deinterleaver adapted to output a plurality of de-interleaved erasure information; and
   an FEC decoder adapted to receive the plurality of blocks of de-interleaved encoded data and the plurality of de-interleaved erasure information and output a stream of decoded data.

29. The decoder of claim 28, wherein the erasure information deinterleaver is adapted to:
   access a record of a column in the erasure table, the record including a row index;
   retrieve an erasure information from the record if the row index is smaller than an address field accessed during a preceding access;
   access a next record if the row index is not smaller than the address field accessed during the preceding access; and
   repeat the retrieving and accessing operations until a last record associated with a last row is accessed and the associated erasure information is retrieved.

30. The method of claim 16 wherein the first address is an address of a last byte of the first one of the plurality of groups of coded data in a column.

* * * * *